United States Patent
Fuergut et al.

(10) Patent No.: US 12,218,029 B2
(45) Date of Patent: Feb. 4, 2025

(54) SEMICONDUCTOR DEVICE WITH IMPROVED PERFORMANCE IN OPERATION AND IMPROVED FLEXIBILITY IN THE ARRANGEMENT OF POWER CHIPS

(71) Applicant: Infineon Technologies Austria AG, Villach (AT)

(72) Inventors: Edward Fuergut, Dasing (DE); Anton Mauder, Kolbermoor (DE); Stephan Voss, Munich (DE); Martin Gruber, Schwandorf (DE)

(73) Assignee: Infineon Technologies Austria AG, Villach (AT)

( * ) Notice: Subject to any disclaimer, the term of this patent is extended or adjusted under 35 U.S.C. 154(b) by 429 days.

(21) Appl. No.: 17/824,484

(22) Filed: May 25, 2022

(65) Prior Publication Data
US 2022/0384305 A1    Dec. 1, 2022

(30) Foreign Application Priority Data
May 26, 2021  (EP) ..................... 21175923

(51) Int. Cl.
*H01L 23/06*     (2006.01)
*H01L 23/00*     (2006.01)
(Continued)

(52) U.S. Cl.
CPC .......... *H01L 23/3735* (2013.01); *H01L 24/48* (2013.01); *H01L 25/072* (2013.01);
(Continued)

(58) Field of Classification Search
CPC ... H01L 23/3735; H01L 24/48; H01L 25/072; H01L 2224/48137; H01L 2224/48225;
(Continued)

(56) References Cited

U.S. PATENT DOCUMENTS 7,985,991 B2 * 7/2011 Kajiwara ............. H01L 21/565
257/268
2009/0243079 A1 10/2009 Lim et al.
(Continued)

FOREIGN PATENT DOCUMENTS

CN        101304010 A     11/2008
DE     112013007122 T5     3/2016
(Continued)

*Primary Examiner* — Theresa T Doan
(74) *Attorney, Agent, or Firm* — Murphy, Bilak & Homiller, PLLC (57) ABSTRACT

A device includes an interposer including an insulative layer between a lower metal layer and a first upper metal layer and a second upper metal layer, a semiconductor transistor die attached to the first upper metal layer and comprising a first lower main face and a second upper main face, with a drain or collector pad on the first main face and electrically connected to the first upper metal layer, a source or emitter electrode pad and a gate electrode pad on the second main face, a leadframe connected to the interposer and comprising a first lead connected with the first upper metal layer, a second lead connected with the source electrode pad, and a third lead connected with the second upper metal layer, and wherein an electrical connector that is connected between the gate electrode pad and the second upper metal layer is orthogonal to a first electrical connector.

14 Claims, 9 Drawing Sheets

(51) Int. Cl.
    *H01L 23/10*         (2006.01)
    *H01L 23/373*       (2006.01)
    *H01L 25/07*         (2006.01)

(52) U.S. Cl.
    CPC ............... *H01L 2224/48137* (2013.01); *H01L 2224/48225* (2013.01); *H01L 2924/1203* (2013.01); *H01L 2924/13055* (2013.01); *H01L 2924/13091* (2013.01)

(58) Field of Classification Search
    CPC ..... H01L 2924/13091; H01L 23/49531; H01L 23/49562; H01L 23/49575; H01L 23/49811; H01L 24/49; H01L 23/49844; H01L 24/05; H01L 24/06; H01L 24/32; H01L 2224/40225; H01L 2224/40245; H01L 2924/181
    USPC ......................................................... 257/703
    See application file for complete search history.

(56) References Cited

U.S. PATENT DOCUMENTS

| | | |
|---|---|---|
| 2016/0284631 A1* | 9/2016 | Cabahug ........... H01L 23/49531 |
| 2017/0025335 A1 | 1/2017 | Liu et al. |
| 2020/0286865 A1 | 9/2020 | Chew et al. |
| 2021/0037674 A1 | 2/2021 | Stella et al. |

FOREIGN PATENT DOCUMENTS

| | | |
|---|---|---|
| EP | 1099252 A1 | 5/2001 |
| EP | 2613352 A2 | 7/2013 |
| JP | 2014022579 A | 2/2014 |
| JP | 2016035970 A | 3/2016 |
| JP | 2019068110 A | 4/2019 |

* cited by examiner

FIGURE 9

SEMICONDUCTOR DEVICE WITH IMPROVED PERFORMANCE IN OPERATION AND IMPROVED FLEXIBILITY IN THE ARRANGEMENT OF POWER CHIPS

BACKGROUND

The increase in power density is a major trend within the power semiconductor market. Besides other aspects heat sinking is important for power semiconductor devices because of the power dissipated by the devices during operation, and also because of the environment that the device may have to operate in. In general, improved heat sinking allows the power semiconductor device to be operated with higher power density.

Another important aspect is the fact that power devices are designed to operate at relatively high voltages, typically 500 V or even higher, compared to other electronic semiconductor devices, such as logic or memory devices. In a conventional packaged power semiconductor device, the backside of the package maybe subject to these voltages under normal operation. It is therefore also of great importance to ensure good electrical insulation between the power device and the rear heat sink.

Still another problem of existing power devices is the lack of flexibility for arranging power devices and/or their contact pads which may lead to unwanted coupling from the load current path to the control current path.

For these and other reasons there is a need for the present disclosure.

SUMMARY

The present disclosure is related to a semiconductor device comprising an insulating interposer substrate, at least one semiconductor die attached to the insulating interposer substrate, and a leadframe connected to the insulating interposer. In particular, the present disclosure is related to a semiconductor power device with improved properties as regards thermal dissipation, safe isolation, and high flexibility in the arrangement of power chips.

A first aspect of the present disclosure is related to a semiconductor device, comprising: —an insulating interposer comprising an insulative layer disposed between a lower metal layer and a first upper metal layer; —at least one semiconductor transistor die attached to the first upper metal layer, the semiconductor transistor die comprising a first lower main face and a second upper main face opposite to the first main face and a drain or collector electrode pad disposed on the first main face and electrically connected to the first upper metal layer of the insulating interposer, a source or emitter electrode pad disposed on the second main face, and a gate electrode pad disposed on the second main face; —a leadframe connected to the insulating interposer, the leadframe comprising a plurality of leads wherein a first lead is connected with the first upper metal layer of the insulating interposer, and a second lead is connected with the source electrode pad, characterized by the insulating interposer comprising a second upper metal layer and the leadframe comprising a third lead which is connected with the second upper metal layer, and wherein a second electrical connector is connected between the gate electrode pad and the third upper metal layer so that it extends in a direction which is essentially orthogonal to an extension direction of a first electrical connector.

A second aspect of the present disclosure is related to a semiconductor device, comprising: —an insulating interposer comprising an insulative layer disposed between a lower metal layer and a first upper metal layer; —at least one semiconductor transistor die attached to the first upper metal layer, the semiconductor transistor die comprising a first lower main face and a second upper main face opposite to the first main face and a drain or collector electrode pad disposed on the first main face and electrically connected to the first upper metal layer of the insulating interposer, a source or emitter electrode pad disposed on the second main face, and a gate electrode pad disposed on the second main face; —a leadframe connected to the insulating interposer, the leadframe comprising a plurality of leads wherein a first lead is connected with the first upper metal layer of the insulating interposer, and a second lead is connected with the source electrode pad, wherein the first lead is divided into two parts, wherein a first part is connected with a front end portion and a second part is connected with a back end portion of the first upper metal layer of the insulating interposer.

A third aspect of the present disclosure is related to a semiconductor device, comprising: —an insulating interposer comprising an insulative layer disposed between a lower metal layer and a first upper metal layer; —at least one semiconductor transistor die attached to the first upper metal layer, the semiconductor transistor die comprising a first lower main face and a second upper main face opposite to the first main face and a drain or collector electrode pad disposed on the first main face and electrically connected to the first upper metal layer of the insulating interposer, a source or emitter electrode pad disposed on the second main face, and a gate electrode pad disposed on the second main face; —a leadframe connected to the insulating interposer, the leadframe comprising a plurality of leads wherein a first lead is connected with the first upper metal layer of the insulating interposer, and a second lead is connected with the source electrode pad, wherein an area of the first upper metal layer is smaller than an area of the lower metal layer of the insulating interposer.

A fourth aspect of the present disclosure is related to a semiconductor device, comprising: —an insulating interposer substrate comprising an insulative layer disposed between a lower metal layer and a first upper metal layer; —at least one semiconductor transistor die attached to the first upper metal layer, the semiconductor transistor die comprising a first lower main face and a second upper main face opposite to the first main face and a drain or collector electrode pad disposed on the first main face and electrically connected to the first upper metal layer of the insulating interposer, a source or emitter electrode pad disposed on the second main face, and a gate electrode pad disposed on the second main face; —a leadframe connected to the insulating interposer, the leadframe comprising a plurality of leads wherein a first lead is connected with the first upper metal layer of the insulating interposer substrate, and a second lead is connected with the source electrode pad; wherein the interposer comprises a further metal layer which is connected with the source pad of the semiconductor die and with the second lead of the leadframe.

A fifth aspect of the present disclosure is related to a semiconductor device, comprising: —an insulating interposer substrate comprising an insulative layer disposed between a lower metal layer and a first upper metal layer; —at least one semiconductor transistor die attached to the first upper metal layer, the semiconductor transistor die comprising a first lower main face and a second upper main face opposite to the first main face and a drain or collector electrode pad disposed on the first main face and electrically connected to the first upper metal layer of the insulating interposer, a source or emitter electrode pad disposed on the second main face, and a gate electrode pad disposed on the second main face; —a leadframe connected to the insulating interposer, the leadframe comprising a plurality of leads wherein a first lead is connected with the first upper metal layer of the insulating interposer substrate, and a second lead is connected with the source electrode pad; wherein the insulating interposer comprises a strip-like further upper metal layer which extends lateral besides the first upper metal layer and in a direction towards the leadframe and is connected with the second lead.

A sixth aspect of the present disclosure is related to a semiconductor device, comprising: —an insulating interposer substrate comprising an insulative layer disposed between a lower metal layer and a first upper metal layer; —at least one semiconductor transistor die attached to the first upper metal layer, the semiconductor transistor die comprising a first lower main face and a second upper main face opposite to the first main face and a drain or collector electrode pad disposed on the first main face and electrically connected to the first upper metal layer of the insulating interposer, a source or emitter electrode pad disposed on the second main face, and a gate electrode pad disposed on the second main face; —a leadframe connected to the insulating interposer, the leadframe comprising a plurality of leads wherein a first lead is connected with the second upper metal layer of the insulating interposer substrate, and a second lead is connected with the source electrode pad; Wherein the first lower metal layer comprises an area which is reduced for an amount of at least 10% or at least 20% or at least 30% at the front end side of the interposer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

FIG. 1 comprises

FIG. 2 comprises FIG. 2A to 2C and shows an example of a semiconductor device according to the second aspect in a perspective view (A), another perspective view from another direction of view (B), and a cross-sectional side view (C).

FIG. 3 comprises FIGS. 3A and 3B and shows an example of a semiconductor device according to the third aspect in a perspective view from above (A) and a perspective view from below (B).

FIG. 4 comprises FIGS. 4A and 4B and shows an example of a semiconductor device comprising a further metal layer connected with the source/sense pad in a perspective view with bond wires connecting the source pads (A) and with a clip connecting the source pads (B).

FIG. 6 comprises FIG. 6A to 6C and shows an example of a semiconductor device according to the fourth aspect in a perspective view with bond wires connected between the source pads and part of the corner and between another part of the corner and the second lead (A), bond wires connected between the source pads and part of the corner and a clip connected between another part of the corner and the second lead (B), and clips connected between the source pads and part of the corner and a clip connected between another part of the corner and the second lead (C).

FIG. 7 comprises FIGS. 7A and 7B and shows an example of a semiconductor device according to the fifth aspect in a perspective view (A), and another perspective view from another direction of view (B).

FIG. 8 comprises FIG. 8A to 8C and shows different examples of semiconductor devices in perspective views, all the depicted devices comprising an electrical device connected between one of the metal layers of the insulating interposer.

FIG. 9 comprises FIGS. 9A and 9B and shows an example of a semiconductor device according to the sixth aspect in a perspective view from below with a first lower metal layer of normal size (A), and a perspective view from below with a first lower metal layer of a reduced area (B).

DETAILED DESCRIPTION

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise. Identical reference numbers refer to the same or similar components.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the abovementioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

Figure 1A:
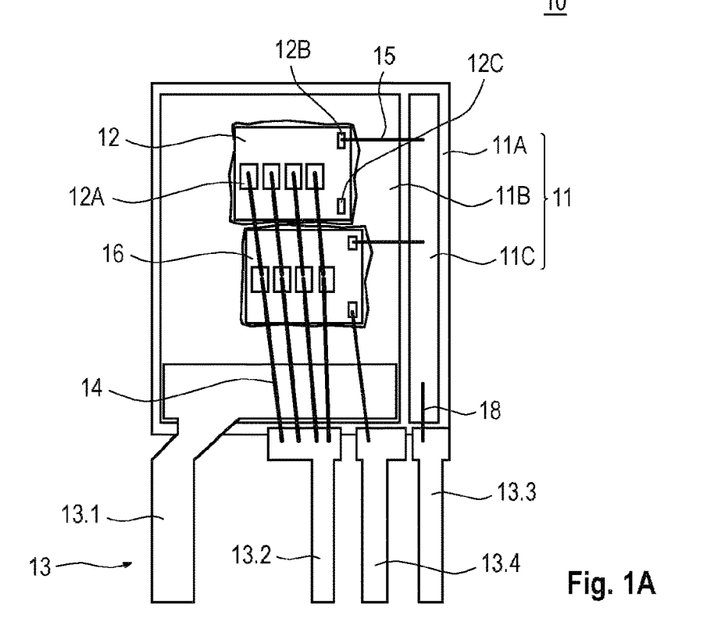
FIGS. 1A and 1B shows an example of a semiconductor device according to the first aspect in a view from above (1A) and a perspective view (1B).
Figure 1B:
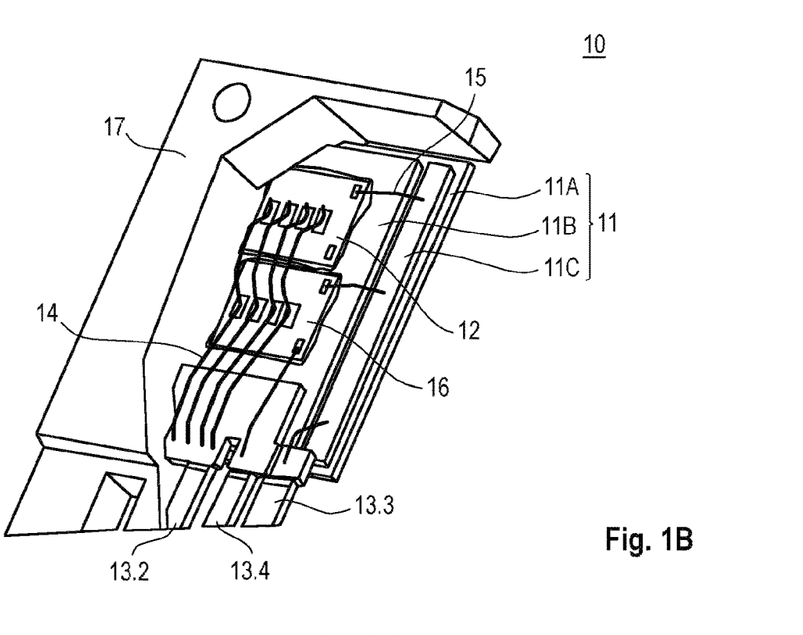

FIG. 1 comprises FIGS. 1A and 1B shows an example of a semiconductor device according to the first aspect in a view from above (A) and a perspective view (B).

In particular, FIG. 1 shows a semiconductor device 10 which comprises an insulating interposer 11 comprising an insulative layer 11A disposed between a lower metal layer (not shown in FIG. 1) and a first upper metal layer 11B. The insulating interposer 11 may comprise, for example, one of a direct copper bond (DCB), an active metal braze (AMB) or an insulated metal substrate (IMS).

The semiconductor device 10 further comprises two semiconductor transistor dies 12 and 16 attached to the first upper metal layer 11B. The semiconductor transistor dies 12 and 16 can be of identical type and can be, for example, IGBT dies or MOSFET dies. The first semiconductor transistor die 12 comprises a first lower main face and a second upper main face opposite to the first main face and a drain or collector electrode pad (not shown) disposed on the first main face and electrically connected to the first upper metal layer 11B of the insulating interposer 11, a source or emitter electrode pad 12A disposed on the second main face, and a gate electrode pad 12B disposed on the second main face. The second transistor die 16 can have electrical contact pads in a similar manner as the first transistor die 12 which contacts pads are not provided with reference numbers in FIG. 1 for the sake of clarity of presentation.

As shown in FIG. 1, a plurality of source pads 12A can be provided in order to provide a respective plurality of current paths. The source pads 12A can be provided in the form of openings in an insulation layer, e.g. a polyimide layer.

The two semiconductor transistor dies 12 and 16 are electrically connected with each other in such a way that their drain contact pads are both electrically connected to the first metal layer 11B of the insulating interposer 11, and their source contact pads are directly connected with each other by means of bond wires (or a clip as will be seen in further embodiments below). The two semiconductor transistor dies 12 and 16 are thus electrically connected in parallel with each other.

The two semiconductor transistor dies 12 and 16 may comprise any semiconductor material. In particular, the two semiconductor transistor dies 12 and 16 may comprise SiC as semiconductor material as it has been found out that the efficiency of SiC transistor dies increases with decreasing size of the transistor die due to better cooling conditions. Two small SiC transistor dies work more efficiently than one big SiC transistor die with the same active areas. Further, smaller semiconductor dies may have better yield so the paralleling of several small dies may be more cost efficient than the use of one large die owing the same current capability as the sum of the small dies.

The semiconductor device 10 further comprises a leadframe 13 which is connected to the insulating interposer 11, the leadframe 13 comprising a plurality of leads wherein a first lead 13.1 is connected with the first upper metal layer 11B of the insulating interposer 11, hence with the common drain electrodes of the two semiconductor dies 12 and 16, and a second lead 13.2 is connected with the source electrode pad 12A, in the embodiment of FIG. 1 with the plurality of source pads of the first and second transistor dies, by means of a respective plurality of bond wires 14. Also a clip can be employed as electrical connector as will be seen in further embodiments below.

The insulating interposer 11 further comprises a second upper metal layer 11C and the leadframe 13 comprises a third lead 13.3 which is connected by a bond wire 18 with the second upper metal layer 11C, wherein a bond wire 15 is connected between the gate electrode pad 12B and the second upper metal layer 11C so that the bond wire 15 extends in a direction which is essentially orthogonal to an extension direction of the bond wires 14. "Essentially orthogonal" can in particular mean that an angle between an extension direction of the bond wires 14 and the bond wire 15 is in a range from 75° to 105°, more specifically from 80° to 100°, more specifically from 85° to 95°. The orthogonality between the extension directions of the bond wires 14 and 15 has the important effect of a reduction of electrical coupling from the load current path of the bond wires 14 to the control current path of the bond wire 15.

The orthogonality between the extension directions of the bond wires 14 and 15 is basically achieved by arranging the second metal layer 11C in the form of an elongate strip layer 11C placed in a lateral relationship with respect to the first metal layer 11B so that the bond wire 15 can be routed directly away from the semiconductor die 12 to create a larger distance between the gate connection and the source/drain load current connections. The strip layer 11C is directed towards the third lead 13.3 and can be connected with the third lead 13.3 by the further bond wire 18.

The gate pad of the second semiconductor transistor die 16 can be connected with the second metal layer 11C in the same way as the gate pad of the first semiconductor die 12, namely with a bond wire which is essentially orthogonal to the bond wires 14 which bond wire is not provided with a reference numbers in FIG. 1 for the sake of clarity of presentation.

The first semiconductor transistor die 12 further comprises a source/sense pad 12C and the leadframe comprises a fourth lead 13.4 wherein only the source/sense pad of the second semiconductor transistor die 16 is connected with a bond wire to the fourth lead 13.4.

FIG. 1B also shows a partially broken away encapsulant 17 which can be applied by one of the molding techniques like, for example, transfer molding, compression molding.

The encapsulant 17 can be comprised of a conventional mold compound like, for example, a resin material, in particular an epoxy resin material. Moreover, the encapsulant 23 can be applied in different aggregate states as, for example, in liquid form, as pellets, or as a granulate. The material of the encapsulant 23 can, in particular, comprise a resin like an epoxy resin material filled with standard filler materials e.g. $SiO_2$ in spherical and/or flake shapes and/or with thermally conductive particles like, for example, made of $Al_2O_3$, BN, AlN, $Si_3N_4$, diamond, or any other thermally conductive particles. The encapsulant 23 can also be made of a plateable mold compound.

Figure 2A:
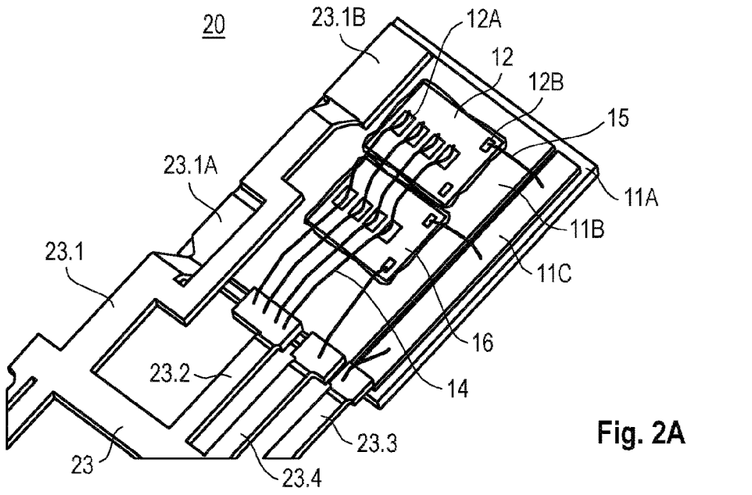
Figure 2B:
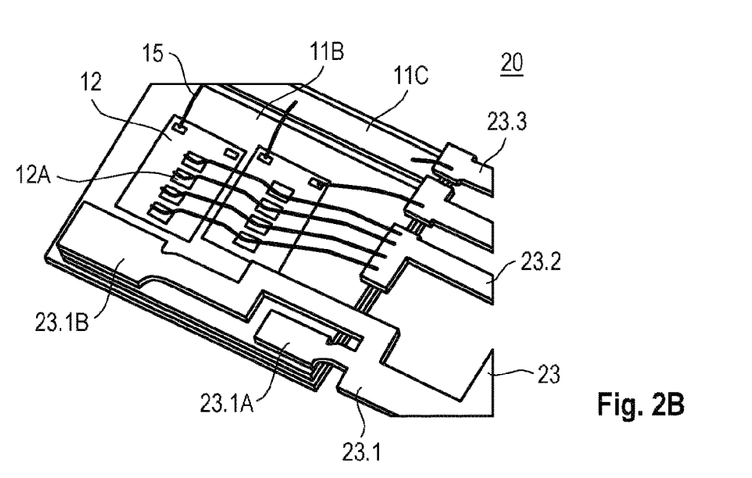
Figure 2C:
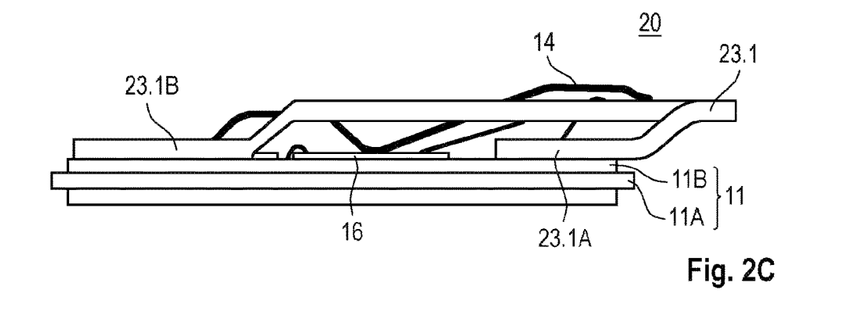

FIG. 2 comprises FIG. 2A to 2C and shows an example of a semiconductor device according to the second aspect.

FIG. 2 shows a semiconductor device 20. It should be noted that the semiconductor device 20 can have similar properties as the semiconductor device 10 of FIG. 1. In particular, the semiconductor device 20 may comprise some or all of the features of the semiconductor device 10 which features are designated in FIG. 2 with the same reference numbers as in FIG. 1.

The semiconductor device 20 differs in one feature from the semiconductor 10 of FIG. 1, namely in the design of the leadframe 23. In particular, the leadframe 23 of the semiconductor device 20 comprises a first lead 23.1 which is divided into two parts, wherein a first part 23.1A is connected with a front end portion and a second part 23.1B is connected with a back end portion of the first metal layer 11B of the insulating interposer 11. In FIGS. 2A and 2C it can be seen that outside the interposer, the lead 23.1 is in one piece and shortly before reaching the interposer, the lead 23.1 is divided into the two portions 23.1A and 23.1B. It should be noted that later in the manufacturing process, e.g. after a molding process, the interconnection between the leads 23.1, 23.2 and 23.3 will be removed (not shown here) in order to avoid a short circuit between the corresponding electrical signals. The first portion 23.1A is then lowered down to the first metal layer 11B while the second portion 23 remains at the original height and is lowered down to the first metal layer 11B before reaching the back end portion of the first metal layer 11B which is on the left hand side of FIG. 2C.

This modified design of the leadframe results in a resilient or springy connection of the interposer with the leadframe. Another advantage is the increased current carrying capacity achieved by the splitting of the first lead. Another advantage besides this spring function is that the leadframe down-set enables an encapsulation without excessive mold-flash. The mold-flash degree can even further improved by employing film-assisted molding.

FIG. 3 shows an example of a semiconductor device according to the third aspect.

FIG. 3 shows a semiconductor device 30. It should be noted that the semiconductor device 30 can have similar properties as the semiconductor device 10 of FIG. 1. In particular, the semiconductor device 30 may comprise some or all of the features of the semiconductor device 10 which features are designated in FIG. 3 with the same reference numbers as in FIG. 1. In deviation from FIG. 1, the interposer 31 does not comprise a second metal layer 11C for gate wiring. Instead the gate pads are directly wire bonded with the third lead 13.3.

In general, and so in the previous Examples of FIGS. 1 and 2, the area of the first metal layer of the interposer is maximized for allowing maximum die size and also better heat spreading. However, the first metal layer is also providing additional capacitance drain to heatsink (which can be on ground potential) which capacitance has to be charged at each switching cycle. For state-of-the-art power switches (even already Si-based), this capacitance has significant contribution to the overall switching losses. For, example, attaching a present CoolMOS device—for example a CoolMOS C6, 180 mOhm, 600V—in a TO-220 package to a heatsink via an insulating foil ($C_{D,\ Heatsink}$~20 pF) adds ~60% to the turn-off losses. The relative increase in turn-off losses is strongly related to the relationship between the output capacitance of the semiconductor switch and the capacitance via the insulating foil. For SiC-MOSFETs with lower area-specific on-state resistance leading to smaller chip area at the same rated on-state resistance and thus lower output capacitance at the same on-state resistance, this effect can be even larger.

Figure 3A:
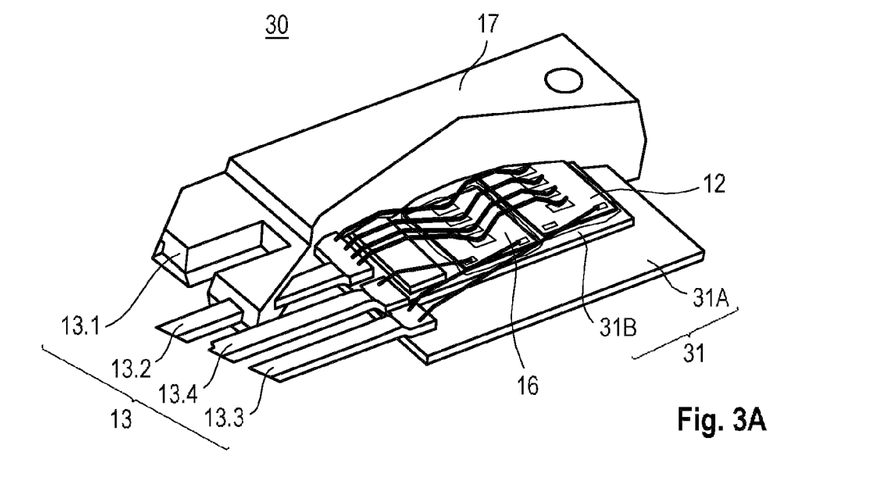
Figure 3B:
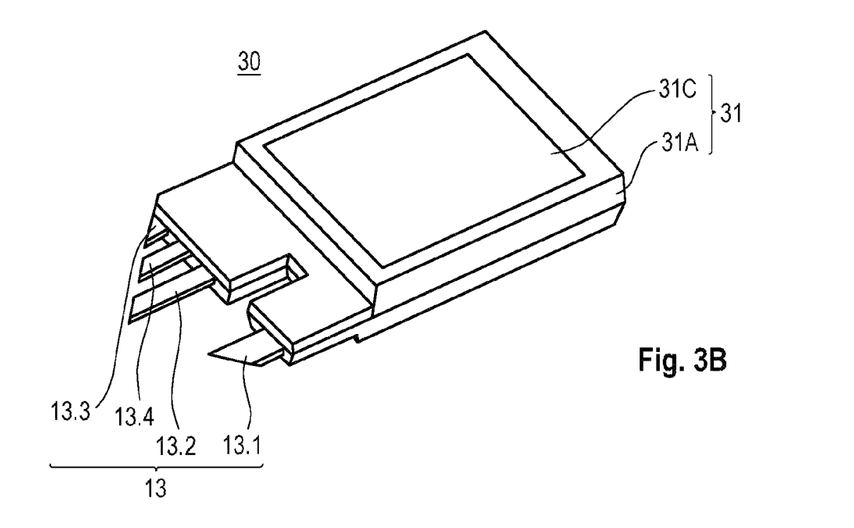

Accordingly, in the embodiment of FIG. 3 the drain area on the front side is reduced to reduce coupling capacitance and switching losses. More specifically, FIG. 3 shows a semiconductor device 30 which comprises an insulating interposer 31 comprising an insulative layer 31A disposed between a first upper metal layer 31B and a lower metal layer 31C. As can be seen in FIGS. 3A and 3B, the area of the first metal layer 31B is smaller than the area of the metal layer 31C. The area of the first metal layer 31B may be at least 10% or at least 20% or at least 30% smaller than the area of the metal layer 31C. In an extreme case, the area of the first metal layer 31B can be made so small that the two semiconductors dies 12 and 16 can just be placed on it.

Figure 4A:
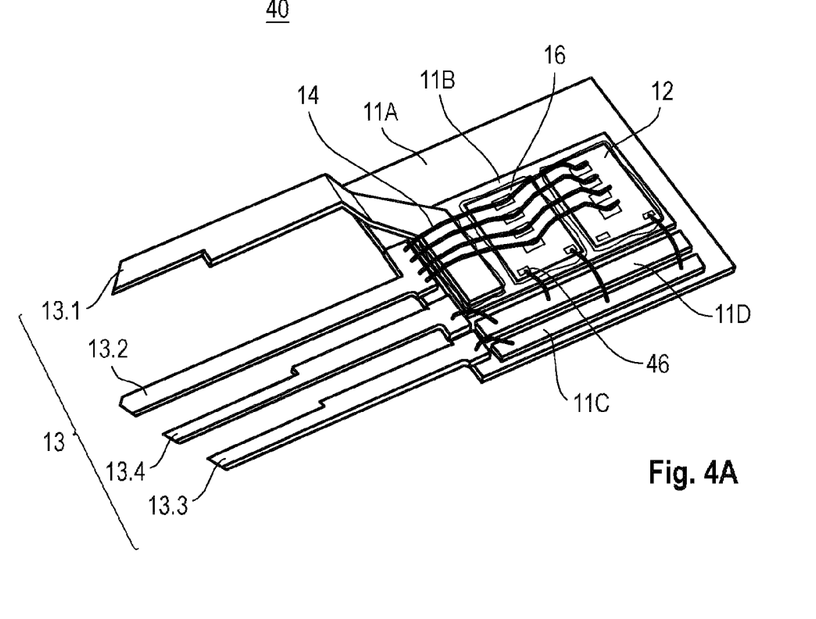
Figure 4B:
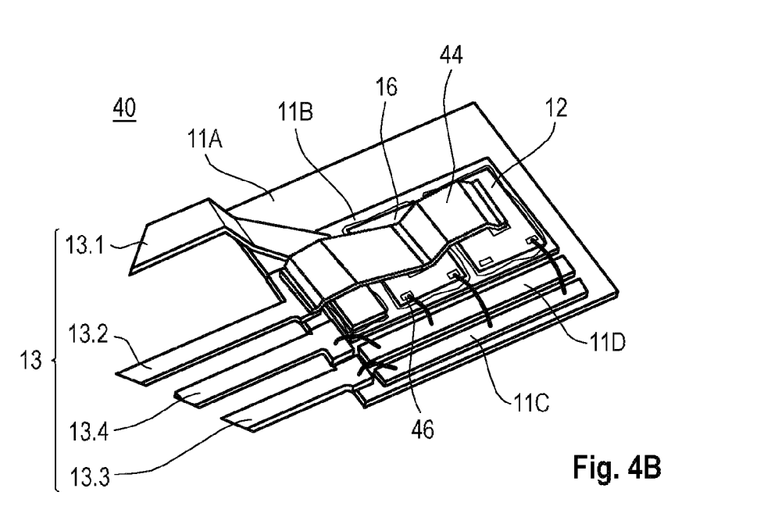

FIG. 4 comprises FIGS. 4A and 4B and shows a further example of a semiconductor device.

FIG. 4A shows a semiconductor device 40. It should be noted that the semiconductor device 40 can have similar properties as the semiconductor device 10 of FIG. 1. In particular, the semiconductor device 40 may comprise some or all of the features of the semiconductor device 10 which features are designated in FIG. 4 with the same reference numbers as in FIG. 1. In deviation from FIG. 1, an interposer with reduced area of the first metal layer such as in FIG. 3 can be used.

According to FIG. 4A the insulating interposer 11 further comprises a third upper metal layer 11D which is configured as a strip-like layer located laterally besides the first metal layer 11B and the second metal layer 11C. A bond wire 46 is connected between the source/sense pad of the second semiconductor die 16 and the third upper metal layer 11D in a similar way as with the bond wire 15 in FIG. 1, namely in such a way that it extends in a direction which is essentially orthogonal to an extension direction of the bond wires 14.

The semiconductor device 40 thus combines a bundle of measures to further improve the functionality of the device. First like in the previous Embodiments gate wiring is again done on the interposer to provide larger capacitance $C_{G\_Ground}$ for low pass filtering the gate signal and reduce the susceptibility to oscillations. Furthermore a configuration is provided in which the third metal layer 11D is used as electrostatic shield of the second metal (gate connection) layer 11C against high $dV_{DS}/dt$ on the first metal (drain connection) layer 11B. Since the area of the first metal layer 11B is reduced (like in the embodiment of FIG. 3), the gap between the first (drain) and third (source/sense) layers 11B and 11D may be enlarged for smaller magnetic coupling, preferably in combination with a small loop between the second (gate) and third (source/sense) metal layers 11C and 11D.

The semiconductor device 40 as shown in FIG. 4B employs a ribbon 40 (or clip) for connecting the source pads with the second lead 13.2 instead of the bond wires 14 as of the embodiment of FIG. 4A. Everything else can be as in the embodiment of FIG. 4A.

Figure 5:
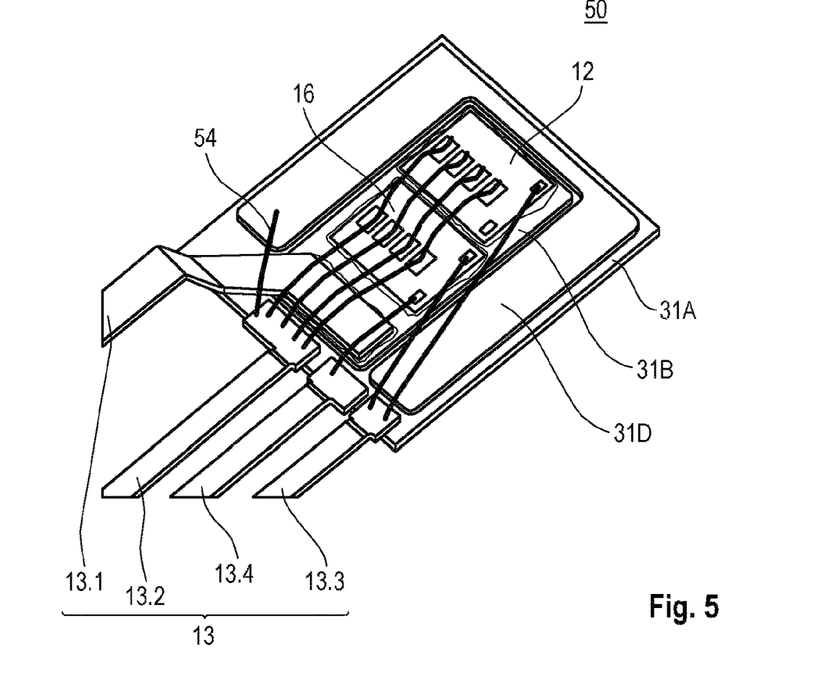
FIG. 5 shows an example of a semiconductor device comprising a further metal layer which surrounds the first metal layer.

FIG. 5 shows an example of a semiconductor device comprising a further metal layer which surrounds the first metal layer.

FIG. 5 shows a semiconductor device 50. It should be noted that the semiconductor device 50 can have similar properties as the semiconductor device 30 of FIG. 3. In particular, the semiconductor device 50 may comprise some or all of the features of the semiconductor device 30 which features are designated in FIG. 5 with the same reference numbers as in FIG. 3.

In addition to the embodiment of FIG. 3 the semiconductor device 50 comprises a further metal layer 31D which at least partially surrounds the first metal layer 31B of the insulating interposer 31, the further metal layer 31D being connected with the second lead 13.3 by means of an electrical connector 54 which can be a bond wire, clip or ribbon. Another option would be to connect the further metal layer 31D with the fourth lead 13.4.

It should be noted in this respect that the embodiment of FIG. 5 has advantages concerning reduced capacitive coupling but with respect to bow engineering or heat spreading, the reduced metal area of the first layer 31B has also disadvantages which can be overcome by adding the further metal layer 31D and connecting it with the second lead 13.2, i.e. to the source potential which in many cases is connected to ground or another fixed electrical potential. It should be added that the term "bow engineering" used here refers to the aspect of a greater bowing of the interposer in a particular step of the processing if the areas of the metallic layers on the upper and lower sides of the interposer are very different.

Figure 6A:
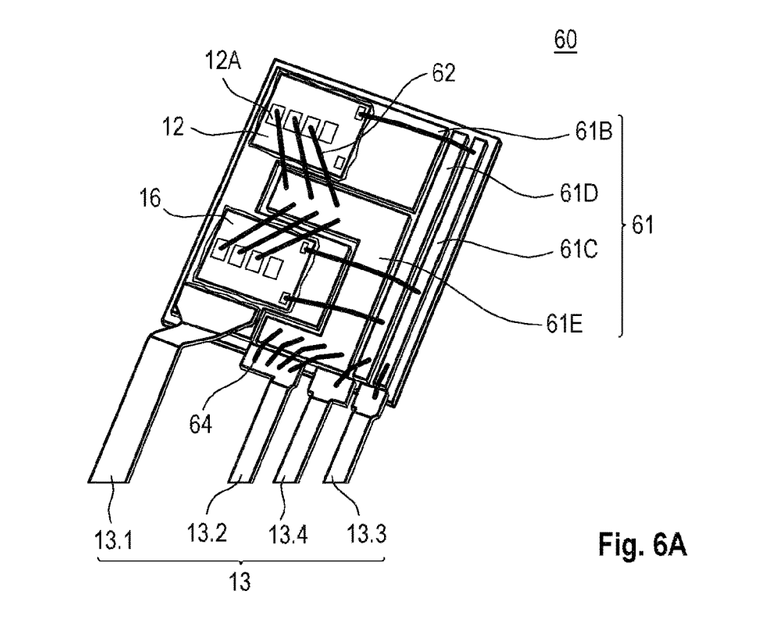
Figure 6B:
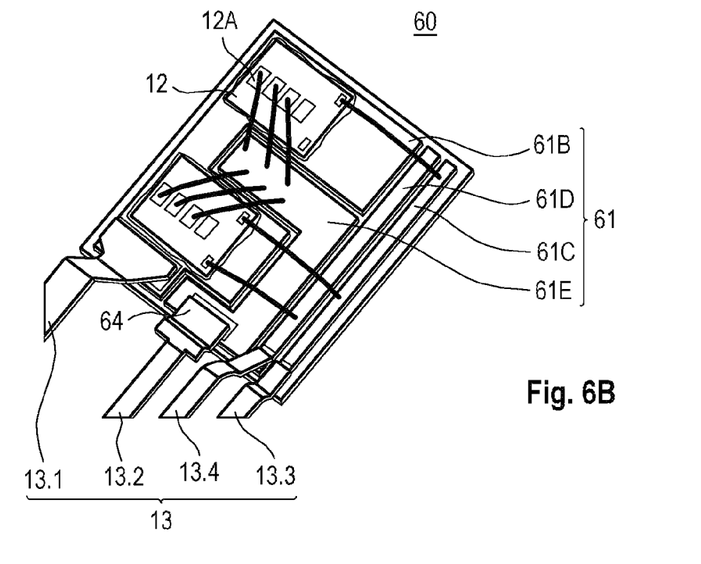
Figure 6C:
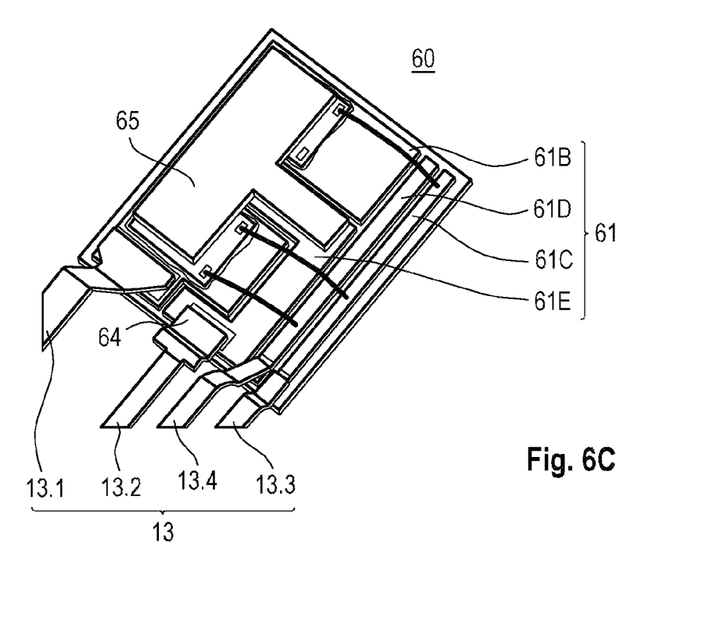

FIG. 6 comprises FIG. 6A to 6C and shows an example of a semiconductor device according to the fourth aspect.

FIG. 6 shows a semiconductor device 60. It should be noted that the semiconductor device 60 can have similar properties as the semiconductor device 40 of FIG. 4, in particular as regards the provision of the metal layers 61C and 61D on the interposer 61 which layers are comparable with the layers 11C and 11D of FIG. 4 and which are used for connecting the gate and source/sense pads on the interposer 61.

In addition to that the interposer 61 comprises a further metal layer 61E which is connected with the source pads of the semiconductor dies 12 and 16.

The use of such a further metal layer 61E on the interposer 61 reduces the stray inductances in the load path because of Eddy currents induced on the second (rear) side metal layer of the interposer.

In particular, in case of two semiconductor dies 12 and 16, the first metal layer 61B may comprise a recess, wherein the two semiconductor dies 12 and 16 are disposed on opposite sides of the recess on the first metal layer 61B. The further metal layer 61E may comprise a portion which extends into the recess of the first metal layer 61B. In particular, the further metal layer 61E may comprise the shape of a corner, one portion of the corner extending into the recess in the first metal layer 61B. The two semiconductor dies 12 and 16 can then be connected with bond wires 62 to the one part of the corner-shaped further metal layer 61E. The other portion of the corner-shaped further metal layer 61E can then be connected with bond wires 63 to the second lead 13.3.

FIG. 6B shows another embodiment of a semiconductor device 60 which differs from the embodiment of FIG. 6A in that a ribbon or clip 64 is used to connect the lower portion of the corner-shaped further metal layer 61E with the second lead 13.3.

FIG. 6C shows another embodiment of a semiconductor device 60 which differs from the embodiments of FIGS. 6A and 6B in that a ribbon or clip 65 is used to connect the source pads with the corner-shaped further metal layer 61E.

Figure 7A:
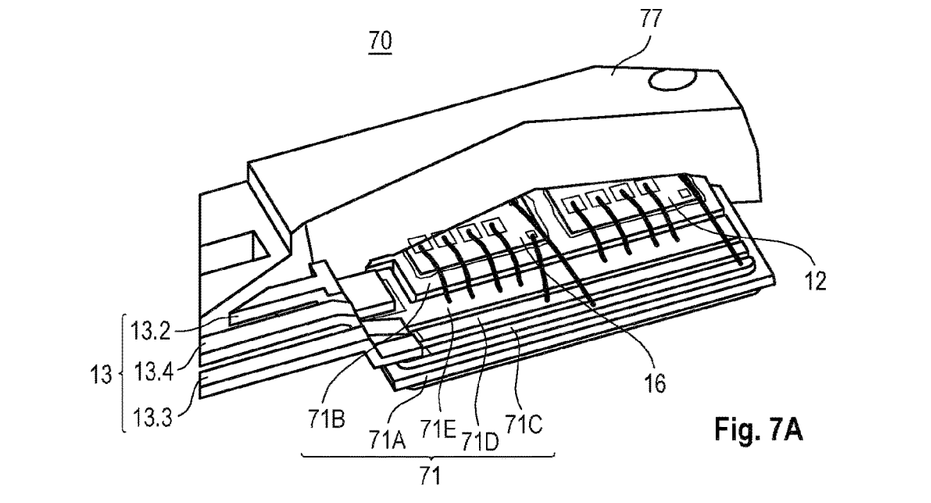
Figure 7B:
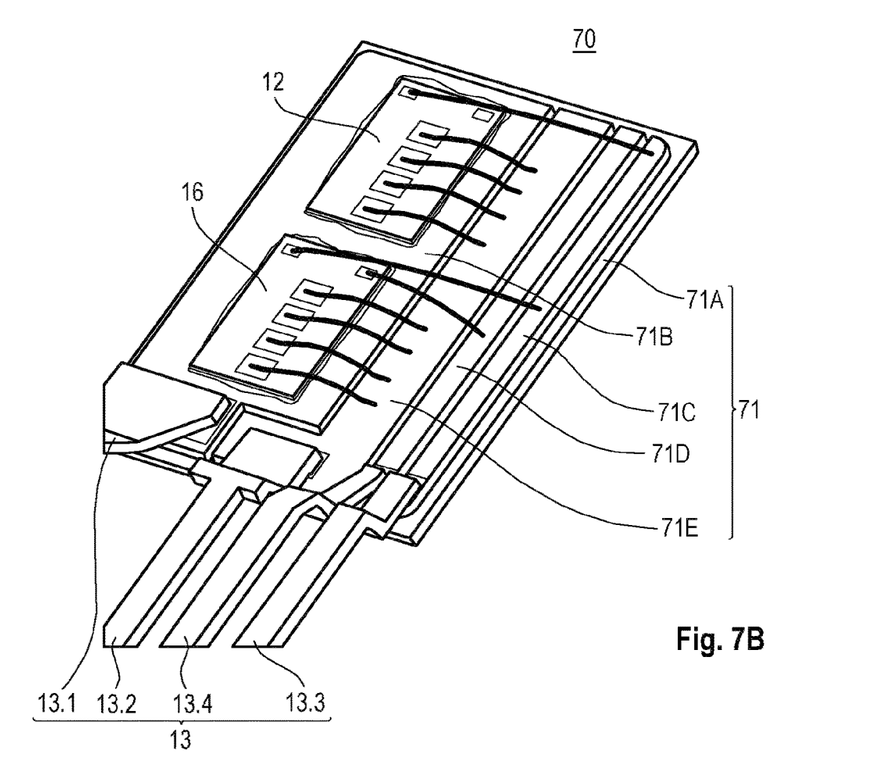

FIG. 7 comprises FIGS. 7A and 7B and shows an example of a semiconductor device according to the fifth aspect.

FIG. 7 shows a semiconductor device 70. It should be noted that the semiconductor device 70 can have similar properties as the semiconductor device 60 of FIG. 6, in particular as regards the provision of the metal layers 71C and 71D on the interposer 71 which layers are comparable with the layers 61C and 61D of FIG. 6 and which are used for connecting the gate and source/sense pads on the interposer 71.

In addition to that the interposer 71 comprises a strip-like further metal layer 71E which is connected by bond wires (or a ribbon or clip) with the source pads of the semiconductor dies 12 and 16. The further metal layer 71E extends lateral along a side edge of the first metal layer 71B and in a direction towards the leadframe and is connected with the second lead.

The first metal layer 71B at device operation is conducting a load current to the semiconductor dies 12, 16. The load current is forming a magnetic field surrounding the first metal layer 71B. The further metal layer 71E forms the return path for the load current. Thus, the magnetic field surrounding the further metal layer 71E partially compensates the magnetic field surrounding the first metal layer 71B. The net magnetic field protruding through the loop formed by the metal layers 71C and 71D providing the control signals to the gates of the semiconductor dies 12, 16 is reduced leading to reduced interference of the load current to the control circuit.

The gap between the further metal layer 71E and the layer 71D can also be further enlarged to reduce the magnetic coupling to the control circuit.

Figure 8A:
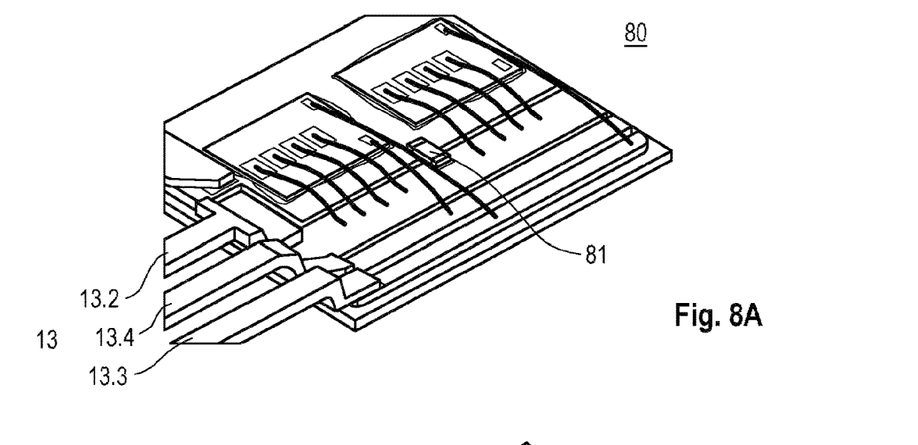
Figures 8B, 8C:
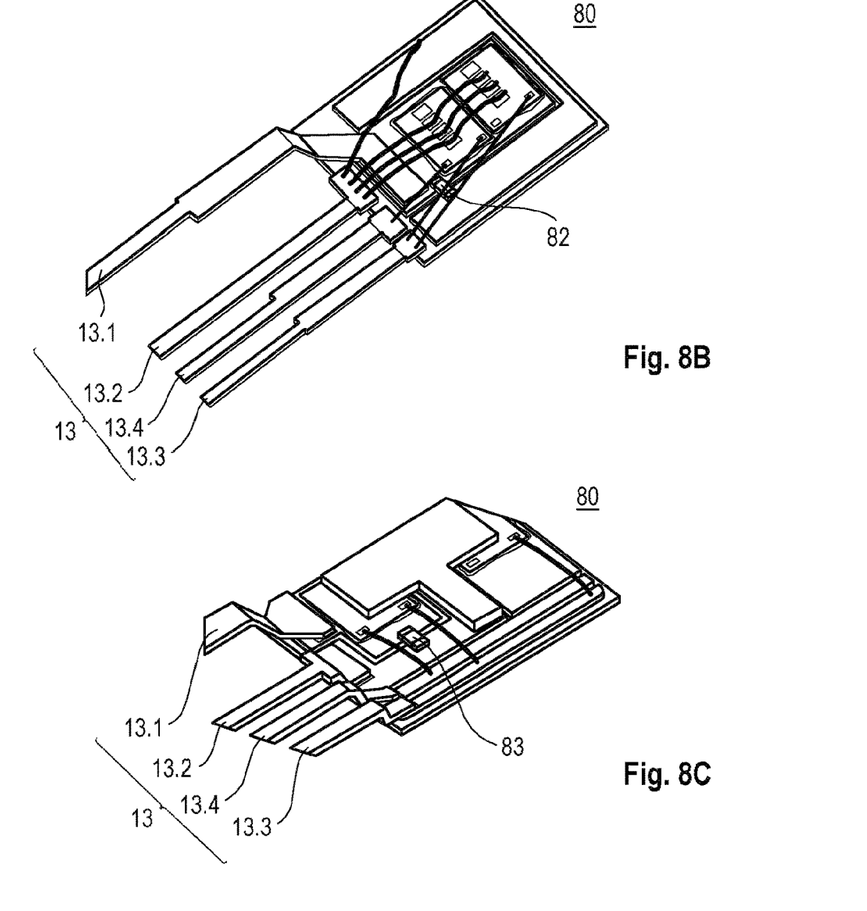

FIG. 8 comprises FIG. 8A to 8C and shows different examples of semiconductor devices, all the depicted devices comprising an electrical device connected between one of the metal layers of the insulating interposer.

FIG. 8A shows a semiconductor device 80 which is comparable with the semiconductor device 70 as depicted in FIG. 7. In addition, the semiconductor device 80 comprises an electrical device 81 connected between the metal layers 71B and 71E.

FIG. 8B shows a semiconductor device 80 which is comparable with the semiconductor device 50 as depicted in FIG. 5. In addition, the semiconductor device 80 comprises an electrical device 82 connected between the metal layers 31B and 31E.

FIG. 8C shows a semiconductor device 80 which is comparable with the semiconductor device 60 as depicted in FIG. 6C. In addition, the semiconductor device 80 comprises an electrical device 83 connected between the metal layers 61B and 61E.

The electrical device 81, 82, or 83 can be one or more of a suppressor diode, an avalanche diode, or any other device configured to actively turn-off the gate in case of an overcurrent or a short circuit.

Figure 9A:
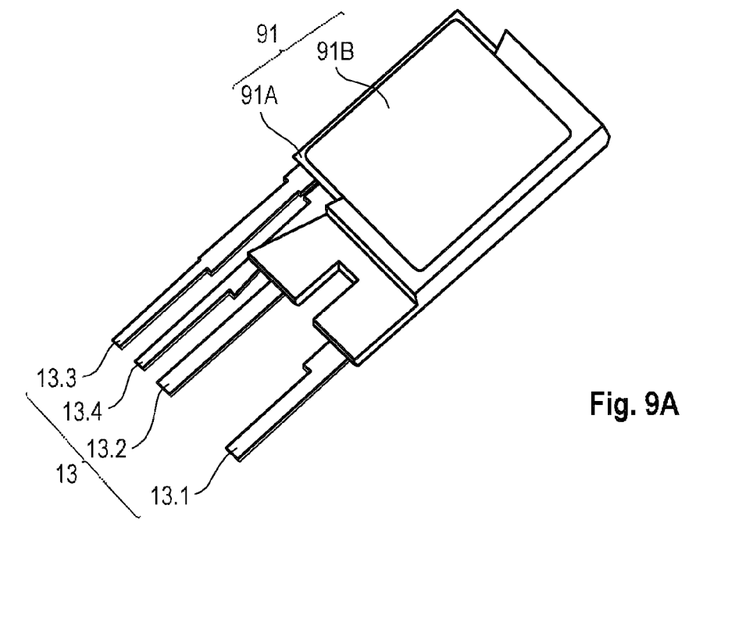
Figure 9B:
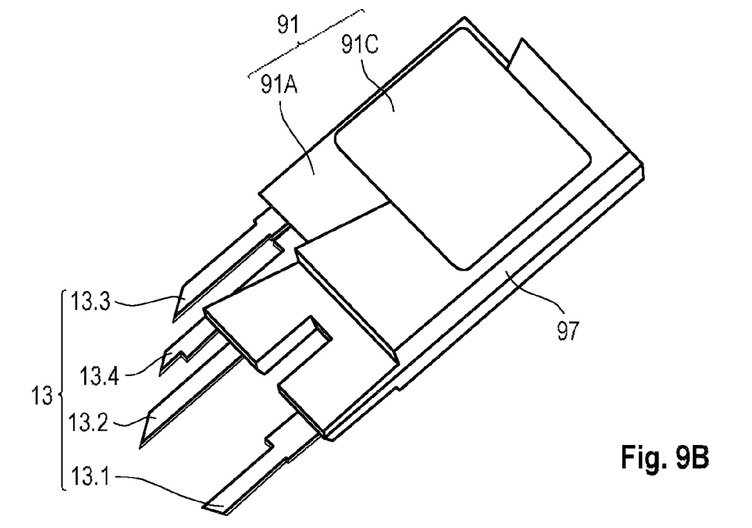

FIG. 9 comprises FIGS. 9A and 9B and shows an example of a semiconductor device according to the sixth aspect in a perspective view from below with a first lower metal layer of normal size (A), and a perspective view from below with a first lower metal layer of a reduced area (B).

As can be seen in FIG. 9B, the area of the second metal layer 91C is reduced in order to reduce the danger of creepage currents from the leads to the second metal layer. The resulting gap is filled with the encapsulant 97. As can also be seen the pull-back is done under passive areas, i.e. the area of connection of leadframe to the interposer front side, and not underneath the power semiconductors for not impairing the thermal resistance.

The pull-back can be at least 10% or at least 20% or at least 30% of the total length of the interposer 91 in a direction leading away from the first lead 13.1. Further, the reduced metal layer leads to a reduced capacitive coupling of the drain of the semiconductor dies to the heatsink and in consequence to lower switching losses as explained in the description of FIG. 3.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A semiconductor device, comprising:
an insulating interposer comprising an insulative layer disposed between a lower metal layer and a first upper metal layer;
at least one semiconductor transistor die attached to the first upper metal layer, the semiconductor transistor die comprising a first lower main face and a second upper main face opposite to the first main face and a drain or collector electrode pad disposed on the first main face and electrically connected to the first upper metal layer of the insulating interposer, a source or emitter electrode pad disposed on the second main face, and a gate electrode pad disposed on the second main face;
a leadframe connected to the insulating interposer, the leadframe comprising a plurality of leads,
wherein a first lead is connected with the first upper metal layer of the insulating interposer, and a second lead is connected with the source electrode pad,
wherein the semiconductor device is characterized by the insulating interposer comprising a second upper metal layer and the leadframe comprising a third lead which is connected with the second upper metal layer, and
wherein an electrical connector is connected between the gate electrode pad and the second upper metal layer so that it extends in a direction which is essentially orthogonal to an extension direction of a first electrical connector.

2. The semiconductor device according to claim 1, wherein the second upper metal layer extends laterally besides the first upper metal layer and in a direction towards the leadframe and is connected by a further electrical connector to the third lead of the leadframe.

3. The semiconductor device according to claim 1, wherein the insulating interposer comprises one of a direct copper bond (DCB), an active metal braze (AMB) or an insulated metal substrate (IMS).

4. The semiconductor device according to claim 1, wherein the semiconductor transistor die comprises an IGBT or MOSFET die.

5. The semiconductor device according to claim 1, further comprising a first semiconductor transistor die and a second semiconductor transistor die both attached to the first metal layer, wherein the first and second semiconductor dies are connected in parallel.

6. The semiconductor device according to claim 1, further comprising the semiconductor die comprising a source/sense pad; the insulating interposer comprising a third upper metal layer wherein a further electrical connector is connected between the source/sense pad and the third upper metal layer.

7. The semiconductor device according to claim 6, wherein the third upper metal layer is disposed between the first upper metal layer and the second upper metal layer.

8. The semiconductor device according to claim 1, wherein the first lead is divided into two parts, wherein a first part is connected with a front end portion and a second part is connected with a back end portion of the first upper metal layer of the insulating interposer.

9. The semiconductor device according to claim 1, wherein an area of the first upper metal layer is smaller than an area of the lower metal layer of the insulating interposer.

10. The semiconductor device according to claim 9, further comprising a further metal layer which at least partially surrounds the first upper metal layer of the insulating interposer, the further metal layer being connected with the second lead or a fourth lead.

11. The semiconductor device according to claim 1, wherein the interposer comprises a further upper metal layer which is connected with the source pad of the semiconductor die and with the second lead of the leadframe.

12. The semiconductor device according to claim 1, wherein the insulating interposer comprises a strip-like further upper metal layer which extends lateral besides the first upper metal layer and in a direction towards the leadframe and is connected with the second lead.

13. The semiconductor device according to claim 12, further comprising an electrical device connected between one of the metal layers of the insulating interposer, the electrical device being one or more of a suppressor diode, an avalanche diode, or any other device configured to actively turn-off the gate in case of an overvoltage, an overcurrent or a short circuit.

14. The semiconductor device according to claim 1, wherein the lower metal layer of the interposer comprises an area which is reduced for an amount of at least 10% or at least 20% or at least 30% at the front end side of the interposer.

* * * * *